United States Patent [19]

Sanders et al.

[11] Patent Number: 5,712,197
[45] Date of Patent: Jan. 27, 1998

[54] METHOD OF MANUFACTURING A SEMICONDUCTOR DEVICE SUITABLE FOR SURFACE MOUNTING

[75] Inventors: Klaastinus H. Sanders; Geert J. Duinkerken, both of Stadskanaal, Netherlands

[73] Assignee: U.S. Philips Corporation, New York, N.Y.

[21] Appl. No.: 645,436

[22] Filed: May 13, 1996

[30] Foreign Application Priority Data

May 12, 1995 [EP] European Pat. Off. .............. 95201234

[51] Int. Cl.[6] .................................................. H01L 21/60
[52] U.S. Cl. ........................ 437/214; 437/209; 437/217; 437/219
[58] Field of Search ............................ 437/209, 210, 437/211, 212, 213, 214, 215, 216, 218, 219, 220

[56] References Cited

U.S. PATENT DOCUMENTS

| | | | |
|---|---|---|---|
| 4,660,127 | 4/1987 | Gunter | 437/219 |
| 4,920,007 | 4/1990 | Shimizu et al. | 437/211 |
| 5,263,242 | 11/1993 | Deo et al. | 437/209 |
| 5,279,029 | 1/1994 | Burns | 437/209 |
| 5,478,402 | 12/1995 | Hanora | 437/219 |
| 5,550,086 | 8/1996 | Tai | 437/217 |
| 5,567,656 | 10/1996 | Chun | 437/214 |

FOREIGN PATENT DOCUMENTS

3148778A1 12/1982 Germany .
59-143348 8/1984 Japan .

*Primary Examiner*—Kevin Picardat
*Attorney, Agent, or Firm*—Norman N. Spain

[57] ABSTRACT

A method of manufacturing a semiconductor device suitable for surface mounting whereby semiconductor elements are interconnected into a coherent row of semiconductor elements by means of conductive strips such that a connection point of a certain semiconductor element is connected to a connection point of a semiconductor element preceding it in the row by means of a strip, and another connection point of said certain semiconductor element is connected to a connection point of a semiconductor element following it in the row, and the row of semiconductor elements is enveloped in a protective material, and the semiconductor elements are mutually separated into individual semiconductor devices provided with two side faces, each side face having a portion of the strip which is processed into a connection conductor in that an electrically conducting layer is provided on the side faces contacting said portion of the strip.

21 Claims, 2 Drawing Sheets

METHOD OF MANUFACTURING A SEMICONDUCTOR DEVICE SUITABLE FOR SURFACE MOUNTING

BACKGROUND OF THE INVENTION

The invention relates to a method of manufacturing a semiconductor device suitable for surface mounting whereby a semiconductor element having a connection point on its first and on its second, opposed main surface is provided with conductive strips which make electrical contact with said connection points, after which the semiconductor element is enveloped in a protective material and the strips are processed into connection conductors of the device.

A device manufactured by such a method is suitable for surface mounting. Such devices, also called "surface mounted devices" (SMDs), have the advantage over conventional components that SMDs are provided on a surface of, for example, a printed circuit board without connection conductors of the device having to be passed through holes in the printed circuit board such as is the case with conventional components.

The English abstract of Japanese Patent Application JP-A-59-143348 discloses a method of the kind mentioned in the opening paragraph whereby a diode semiconductor element is provided with two copper strips on connection points which in this case form the cathode and anode of the diode. The diode and a portion of each strip are enveloped in a resin, after which the strips are processed into connection conductors in that the strips are bent around a side face of the device.

The known method described has the disadvantage that the method of manufacturing the device is comparatively expensive, while in addition problems arise in the mechanization of the semiconductor device manufacturing process with increasing miniaturisation.

SUMMARY OF THE INVENTION

The invention has for its object inter alia to counteract said disadvantages.

According to the invention, the method is for this purpose characterized in that semiconductor elements are interconnected into a coherent row of semiconductor elements by means of conductive strips such that a connection point of a certain semiconductor element is connected to a connection point of a semiconductor element preceding it in the row by means of a strip, and another connection point of said certain semiconductor element is connected to a connection point of a semiconductor element following it in the row, after which the row of semiconductor elements is enveloped in a protective material and the semiconductor elements are mutually separated into individual semiconductor devices provided with two side faces, each with a portion of the relevant strip, after which each strip is processed into a connection conductor in that an electrically conducting layer is provided on the side faces, contacting said portion of the strip.

In the method according to the invention, accordingly, the semiconductor elements are interconnected so as to form a coherent row in that two connection points of adjacent semiconductor elements are interconnected each time. A connection point is here understood to be a point where a semiconductor element can be connected, for example, an emitter, base, collector, source, drain, or gate connection. A row is thus created wherein, for example, a connection point of a semiconductor element on the first main surface is connected to a connection point of a preceding semiconductor element in the row, while another connection point, i.e. on the second main surface, is connected to a connection point of a next semiconductor element. It is achieved thereby that the coherent row of semiconductor elements can be enveloped in a protective material in one operation. This gives a considerable cost saving in enveloping, while the coherent row is much easier to handle than the individual semiconductor elements in the known method, so that no problems arise in the mechanization of the manufacture of the semiconductor devices with increasing miniaturisation.

The row of semiconductor elements may be enveloped in that a protective layer such as a paste or paint is provided on the row of semiconductor elements. Preferably, the method according to the invention is characterized in that the row of semiconductor elements is enveloped in a protective material in that the row of semiconductor elements is placed in a mould cavity and said mould cavity is filled with a resin. The coherent row of semiconductor elements is provided in this case with an envelope of, for example, epoxy resin. It is possible to place one row of semiconductor elements or several such rows in one mould cavity, after which the row(s) is (are) enveloped. After enveloping, the row(s) is (are) subdivided into individual semiconductor devices by means of, for example, sawing.

The method is preferably characterized in that the row of semiconductor elements is placed in the mould cavity on support points which support the strips in locations where the semiconductor elements will be separated, while the strips for the rest do not bear on a wall of the mould cavity, apart from possibly an initial and a final strip of the row. The row of semiconductor elements can be completely supported in the mould cavity in this manner. The row will then be substantially completely enveloped by the resin. The semiconductor elements will be separated and side faces of the device will be formed later in the manufacturing process in locations where the strips are supported. The strips have no further contact points with the mould cavity wall, apart from an initial strip and a final strip of the row and the support points, i.e. the row of semiconductor elements is fully inside the mould cavity. The strips do not project from the mould cavity, so that no complicated sealing along strips is necessary when making a sealing along an edge of the mould cavity. Portions of the mould wherein the cavity is present are much easier to manufacture thanks to this measure. The initial and final strips of the row of semiconductor elements may be placed outside the mould cavity, for example, for clamping the row between parts of the mould in which the mould cavity is present. Alternatively, however, the initial and final strips may also be advantageously placed entirely within the mould cavity. No sealing need be provided along strips then.

Preferably, the strips are provided with holes and contact points for projections, the row of semiconductor elements being positioned in the mould cavity in the method such that the projections enter the holes. The row may thus be positioned inside the mould cavity in a simple manner.

The shape of the semiconductor device may be freely chosen. Preferably, however, the method is characterized in that a mould cavity is used which has a substantially rectangular shape, while the row of semiconductor elements is positioned with its longitudinal direction in the longitudinal direction of the mould cavity. Devices are then manufactured of a substantially rectangular box shape after separation. Such a rectangular shape is highly suitable for surface mounting.

BRIEF DESCRIPTION OF THE DRAWINGS

The invention will be explained in more detail below by way of example with reference to drawings, in which.

The Figures are purely diagrammatic and not drawn to scale. Corresponding parts have generally been given the same reference numerals in the Figures.

DETAILED DESCRIPTION OF THE PREFERRED EMBODIMENTS

Figure 1:
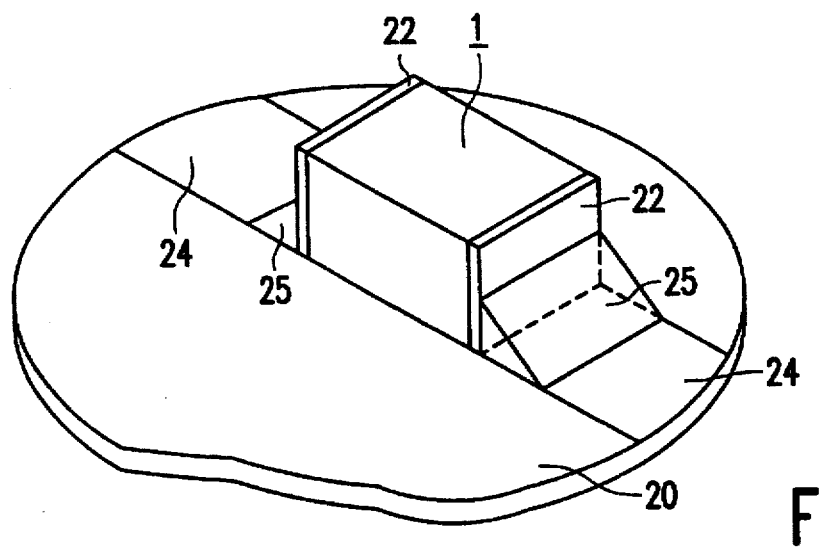
FIG. 1 shows a semiconductor device manufactured by the method and mounted on a printed circuit board.

FIG. 1 shows a semiconductor device 1 suitable for surface mounting and manufactured by method. Such a device 1, also called "surface mounted device" (SMD) has the advantage over a conventional component that the SMD is provided on a surface of, for example, a printed circuit board 20 without connection conductors 22 of the device 1 having to be passed through holes in the printed circuit board 20, such as is the case with conventional components. The device 1 is placed on conductor tracks 24 of the printed circuit board 20 and the connection conductors 22 are connected to the conductor tracks 24, for example, with solder 25.

Figure 2:
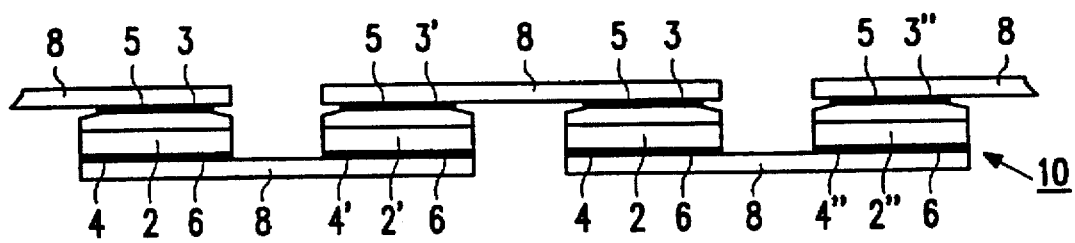
FIGS. 2 to 7 show various stages in the manufacture of a semiconductor device by the method according to the invention.

FIGS. 2 to 7 show stages of the method according to the invention. FIG. 2 shows how a semiconductor element 2 is provided with conductive strips 8 on its connection points 3 and 4 on its respective first and second, mutuallay opposed main surface 5 and 6, which strips make electrical contact with the connection points 3, 4. In this example, the semiconductor elements are diode crystals with a pn junction which extends parallel to the main surfaces 5, 6 between the two connection points 3, 4, which connection points 3, 4 form the cathode and anode connection points of the diode. The diode is of substantially square shape with dimensions of 1×1 mm and a thickness of 0.5 min. The strips 8 in this embodiment are manufactured from copper and have dimensions length×width×height of 5×2×0.5 min. The strips 8 are connected to the connection points 3, 4 by a known soldering technique. According to the invention, semiconductor elements 2 are interconnected by the conductive strips 8 so as to form a coherent row 10 of semiconductor elements 2 in that a connection point 3 of a certain semiconductor element 2 is connected to a connection point 3' of a semiconductor element 2' preceding the former in the row by means of a strip 8, and another connection point 4 of said certain semiconductor element 2 is connected to a connection point 4" of a semiconductor element 2" following it in the row.

Figure 3:
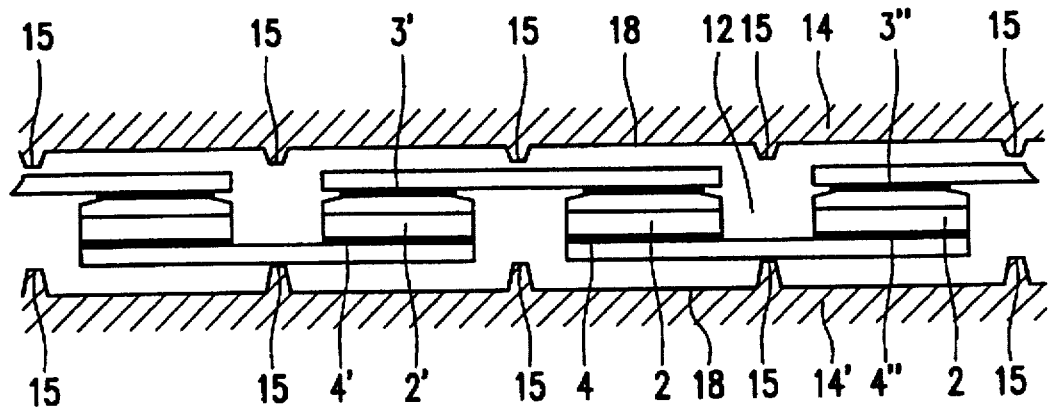

FIG. 3 shows how the row 10 of semiconductor elements 2 is enveloped in a protective material in that, according to the invention, the row of semiconductor elements 2 is placed in a mould cavity 12 and the mould cavity 12 is filled with a resin. The coherent row 10 of semiconductor elements 2 is thus provided with an envelope 16 of, for example, epoxy resin. Epoxy resins are materials known per se for enveloping semiconductor elements.

Preferably, the row 10 of semiconductor elements 2 is placed in the mould cavity 12 on support points 15 which support the strips 8 in locations where later the semiconductor elements 2 will be separated, while the strips 8 make no further contact with a wall 18 of the mould cavity, apart from possibly an initial and a final strip 8 of the row 10. The row 10 of semiconductor elements 2 can be supported in this manner in the mould cavity 12. The row 10 is then practically completely enveloped by the resin. The strips 8 are not enveloped in those locations only where the strips 8 are supported. The strips 8 do not lie against the wall of the mould cavity 12, apart from possibly an initial strip and a final strip 8 of the row 10 and the support points 15, i.e. the row 10 of semiconductor elements 2 is fully enclosed in the mould cavity 12. The strips 8 do not project from the mould cavity 12, so that no complicated sealing along strips 8 is necessary when a sealing is made along an edge of the mould cavity 12. Parts of the mould 14, 14' in which the cavity 12 is present are much easier to manufacture thanks to this measure. The initial and final strips 8 of the row of semiconductor elements 2 may be placed outside the mould cavity 12, if so desired, for example for clamping the row 10 tightly between parts 14, 14' of the mould in which the mould cavity 12 is present. It is quite possible, alternatively, for the initial and final strips 8 to be placed entirely inside the mould cavity 12, in which case only the support points 15 supply the support of the row 10.

Preferably, strips 8 are provided with holes, while support points 15 are provided with projections (not shown), the row 10 of semiconductor elements 2 being so placed in the mould cavity 12 according to the method that the projections enter the holes. The row 10 may thus be positioned inside the mould cavity 12 in a simple manner.

The shape of the semiconductor device 1 may be freely chosen. A mould cavity 12 is used in this example which has a practically rectangular shape, the row 10 of semiconductor elements 2 being placed with its longitudinal direction in the longitudinal direction of the mould cavity (see FIG. 3). Devices 1 are then manufactured of a substantially rectangular box shape (see FIG. 1). Such a rectangular shape is highly suitable for surface mounting.

Figure 4:
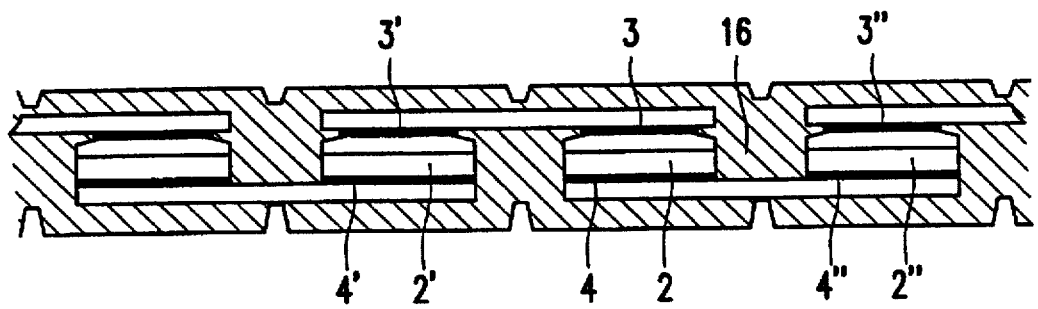
Figure 5:
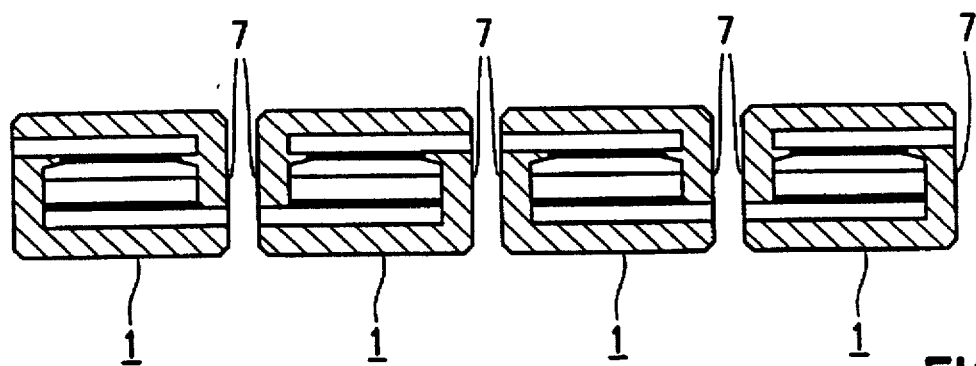
Figure 6:
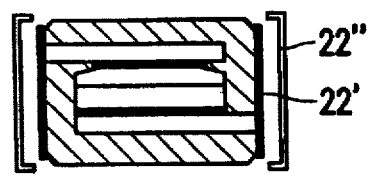
Figure 7:
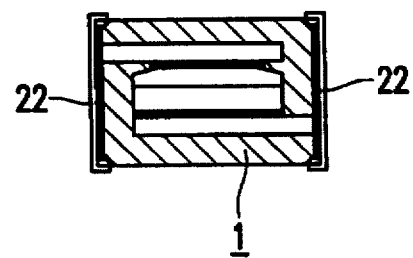

FIG. 4 shows the row 10 of semiconductor elements after the protective material 16 has been provided. The semiconductor elements 2 are separated from one another, so as to form individual semiconductor devices 1, in locations where the support points 15 in the mould cavity 12 supported the row 10, said devices being provided with two side faces 7 with a portion of the strip 8 each, for example, in that the row is subdivided into separate semiconductor devices 1 in a known sawing process. See FIG. 5. The sawn surfaces then form the side faces 7. Since the strip 8 has also been sawn through, the side face 7 comprises a portion of the strip 8. The strip 8 is processed into a connection conductor 22 in that an electrically conducting layer 22', 22" is provided on the side faces 7, contacting said portion of the strip 8. The electrically conducting layer comprises a conductive paste 22' which is provided on the side faces in known manner, for example a soldering paste. A copper cap 22" is provided over the soldering paste, which renders possible an easy contacting of the semiconductor device by known techniques such as soldering. See FIGS. 6 and 7.

The method according to the invention renders it possible for the coherent row 10 of semiconductor elements 2 to be enveloped in a protective material 16 in one operation. This leads to a considerable cost saving in enveloping, while the coherent row 10 is much easier to handle than individual semiconductor elements 2 in a known method, so that no problems will arise in the mechanization of the manufacture of the semiconductor devices also with increasing miniaturisation.

The invention is not limited to the embodiment described above. In the example, a semiconductor device is manufactured where an anode and a cathode connection point of a diode are connected to a connection conductor. However, other connection points such as, for example, emitter, base, collector, source, drain, or gate connection points of semiconductor elements such as, for example, transistors, thyristors, and ICs may be connected to a connection conductor by the method according to the invention.

It is also possible in the method to connect semiconductor elements having more than two connection points, for example transistors or ICs. One or several strips 8 are then provided on each main surface. The connection conductors on the side faces are structured in dependence on the number of strips forming part of the relevant side face, for example by photolithographical techniques and etching, or by other techniques known per se such as, for example, screen printing.

The strips 8 in the present example were manufactured from copper, but it is alternatively possible for some other conductive material to be used for the strip 8. In the embodiment, the connection point 3 is connected to the connection point 3' of a preceding semiconductor element 2' (see FIG. 2). It is obviously also possible for the connection point 3 to be connected to the connection point 4' of the preceding semiconductor element 2'. The preceding element 2' is then as it were reversed relative to the element 2.

In the embodiment, the electrically conducting layer 22 is formed by a soldering paste and a cap. It is quite possible, alternatively, for the layer 22 to comprise only a conductive paste or, for example, a conductive layer provided by, for example, electrochemical or vapour-deposition techniques.

Certain techniques for manufacturing the semiconductor device 1 were mentioned in the above description. By no means does this imply that the method according to the invention can only be implemented by such techniques. Thus, for example, a technique other than soldering may be used, for example, a conductive glue technique.

What is claimed is:

1. A method of manufacturing a semiconductor device suitable for surface mounting, the semiconductor device comprising a semiconductor element having a connection point on a first main surface, the method comprising the steps of:

interconnecting a first semiconductor element and a second semiconductor element into a coherent row by means of a first conductive strip connecting a connection point of the first semiconductor element to a connection point of the second semiconductor element, enveloping the row in a protective material, separating the first and second semiconductor elements of the row so as to form at least one individual semiconductor device provided with at least a first side surface having a portion of the first conductive strip exposed thereat, and processing so as to form, in association with the portion of the first conductive strip, a connection conductor.

2. A method as claimed in claim 1, characterized in that the step of enveloping the row of semiconductor elements in a protective material comprises placing the row of semiconductor elements in a mould cavity and filling said mould cavity with a resin.

3. A method as claimed in claim 2, characterized in that the step of placing the row of semiconductor elements in the mould cavity comprises using support points which support the conductive strip in locations where the semiconductor elements will be separated.

4. A method as claimed in claim 3, characterized in that the method further comprises providing the strip with one or more holes and providing the support points with one or more projections corresponding to the holes so that the projections enter the holes during said placing step.

5. A method as claimed in claim 3, characterized in that the enveloping step comprises using a mould cavity which has a substantially rectangular shape, and the row of semiconductor elements is placed in the mould cavity so that the longitudinal direction of the row is in the longitudinal direction of the mould cavity.

6. A method as claimed in claim 1, characterized in that the step of separating of the semiconductor elements comprises a sawing process.

7. A method as claimed in claim 1, characterized in that the step of processing comprises providing an electrically conducting layer on said first side surface of said individual semiconductor device, said electrically conducting layer being in electrical contact with said portion of said first conductive strip.

8. A method as claimed in claim 7, characterized in that the step of processing comprises providing an electrically conducting layer by placing conductive paste in contact with said portion of said first conductive strip and applying a conductive cap over said paste.

9. A method as claimed in claim 1, characterized in that the step of interconnecting comprises using first and second semiconductor elements which have respective connection points disposed on corresponding respective first main surfaces of said semiconductor elements.

10. A method as claimed in claim 9, characterized in that the method comprises the step of further interconnecting said second semiconductor element with a third semiconductor element in said coherent row by means of a second conductive strip connecting a second connection point of said second semiconductor element with a connection point of said third semiconductor element.

11. A method as claimed in claim 1, characterized in that the method comprises the step of further interconnecting said second semiconductor element with a third semiconductor element in said coherent row by means of a second conductive strip connecting a second connection point of said second semiconductor element with a connection point of said third semiconductor element.

12. A method as claimed in claim 11, characterized in that the step of further interconnecting comprises using a second semiconductor element which has said second connection point disposed on a second main surface of said second semiconductor element, said second main surface being opposed to said first main surface.

13. A method as claimed in claim 12, characterized in that the step of separating comprises separating the second semiconductor element from the first and third semiconductor elements so that the second semiconductor element is provided with a second side surface having a portion of the second conductive strip.

14. A method as claimed in claim 13, characterized in that the step of processing comprises forming a connection conductor in association with the second conductive strip.

15. A method as claimed in claim 14, characterized in that the step of processing further comprises providing electrically conducting layers on the respective first and second side surfaces of said second semiconductor element, said electrically conducting layers being in electrical contact with respective said portions of said first and second conductive strips.

16. A method as claimed in claim 15, characterized in that the step of processing comprises providing an electrically conductive layer by placing conductive paste in contact with said portions of said first and second conductive strips and applying a conductive cap over said paste on each of said first and second side surfaces.

17. A method as claimed in claim 11, wherein said first and second conductive strips comprise a single strip and said first and second connection points of said second semiconductor element comprise one connection point.

18. A method as claimed in claim 1, wherein the method comprises using at least one semiconductor element having a plurality of connection points.

19. A method as claimed in claim 18, wherein the method comprises using a plurality of conductive strips, each strip for connecting to a respective connection point of said at least one semiconductor element.

20. A method as claimed in claim 18, wherein the method comprises using said at least one semiconductor element to manufacture a transistor or integrated circuit.

21. A method as claimed claim 18, wherein the method comprises using a plurality of conductive strips and forming a plurality of connection conductors on at least one side surface of said at least one semiconductor element, the connection conductors being structured in dependence on the number of conductive strips forming part of the relevant side surface.

* * * * *